United States Patent
Sun et al.

(10) Patent No.: US 6,984,998 B2
(45) Date of Patent: Jan. 10, 2006

(54) MULTI-FUNCTION PROBE CARD

(75) Inventors: Horng-Chuan Sun, Hsin-chu (TW); Hui-Pin Yang, Tai-ping (TW)

(73) Assignee: MJC Probe Inc., Hsin-Chu (TW)

( * ) Notice: Subject to any disclaimer, the term of this patent is extended or adjusted under 35 U.S.C. 154(b) by 0 days.

(21) Appl. No.: 10/895,051

(22) Filed: Jul. 21, 2004

(65) Prior Publication Data

US 2005/0184741 A1    Aug. 25, 2005

(30) Foreign Application Priority Data

Feb. 24, 2004   (TW) ............................... 93104515 A (51) Int. Cl.
    *G01R 31/02* (2006.01)
(52) U.S. Cl. ..................... 324/754; 324/761
(58) Field of Classification Search ................ 324/754, 324/755, 758, 760, 763, 765
    See application file for complete search history.

(56) References Cited

U.S. PATENT DOCUMENTS

| | | | |
|---|---|---|---|
| 5,070,297 A * | 12/1991 | Kwon et al. ................. | 324/754 |
| 6,072,325 A * | 6/2000 | Sano ........................... | 324/758 |
| 6,075,373 A * | 6/2000 | Iino ............................ | 324/754 |
| 6,570,397 B2 * | 5/2003 | Mayder et al. ............. | 324/754 |
| 6,590,381 B1 * | 7/2003 | Iino et al. ................. | 324/158.1 |
| 6,734,691 B2 * | 5/2004 | Saijyo et al. ............... | 324/762 |
| 6,900,653 B2 * | 5/2005 | Yu et al. ..................... | 324/762 |

* cited by examiner

*Primary Examiner*—Jermele M. Hollington
(74) *Attorney, Agent, or Firm*—Troxell Law Office, PLLC (57) ABSTRACT

A multi-function probe card (40) includes a PCB (41), a plurality of probe needles (47), a counter (71) to acquire a "piece sequence parameter", a signal-measuring device (72) via the probe needles (71) to acquire a current, and a voltage parameters etc. as well as a parametric processing system (74). The parametric processing system (74) includes an I/O unit (51)/(59), a processing unit (52), a time providing unit (55), a real time display unit (56), and a storing unit (57). Moreover, the piece sequence parameter, current parameter, and voltage parameter can be input into the processing unit (52) through the I/O unit (51)/(59). Thereafter, a parametric data structure can be set up to record and calculate in accordance with the datum and parameters, and finally to display service processes and conditions of the probe card (40) through the real time display unit (56).

10 Claims, 6 Drawing Sheets

MULTI-FUNCTION PROBE CARD

BACKGROUND OF THE INVENTION

1. Field of the Invention

The invention relates to a multi-function probe card, and more particularly, to a multi-function probe card that can applies in the conventional probe card for measuring the condition, recording the complete parametric data, and providing real time display or alarm signals of the probe card.

2. Description of the Prior Art

During the process of manufacturing a semiconductor, the wafer, after being finished in manufacturing, will be in the stage of die (also called bare die for the wafer before the packaging stage) testing. The die testing is then performed by making use of a test machine and a probe card, to test the dies on the wafer. The die testing is to assure if the electrical characteristics and performance of the manufactured dies meet the designed specification. The test machine is specially designed to have its probe head provided with probe needles that are as delicate as hairs. These probe needles are used to make contact with the pads on the dies in order to input signal or to read out the output values.

During the course of die testing, those dies that are failed to pass the testing will be labeled as bad products and screened out during the dicing process of the wafer, and only those dies that are able to perform normal function can be processed to be performed packaging. Die testing are indispensable process for reducing cost and increasing yield. Probe card with good quality is the target for the manufacturing and the "research and development" departments to endeavor and pursuit.

Figure 1:
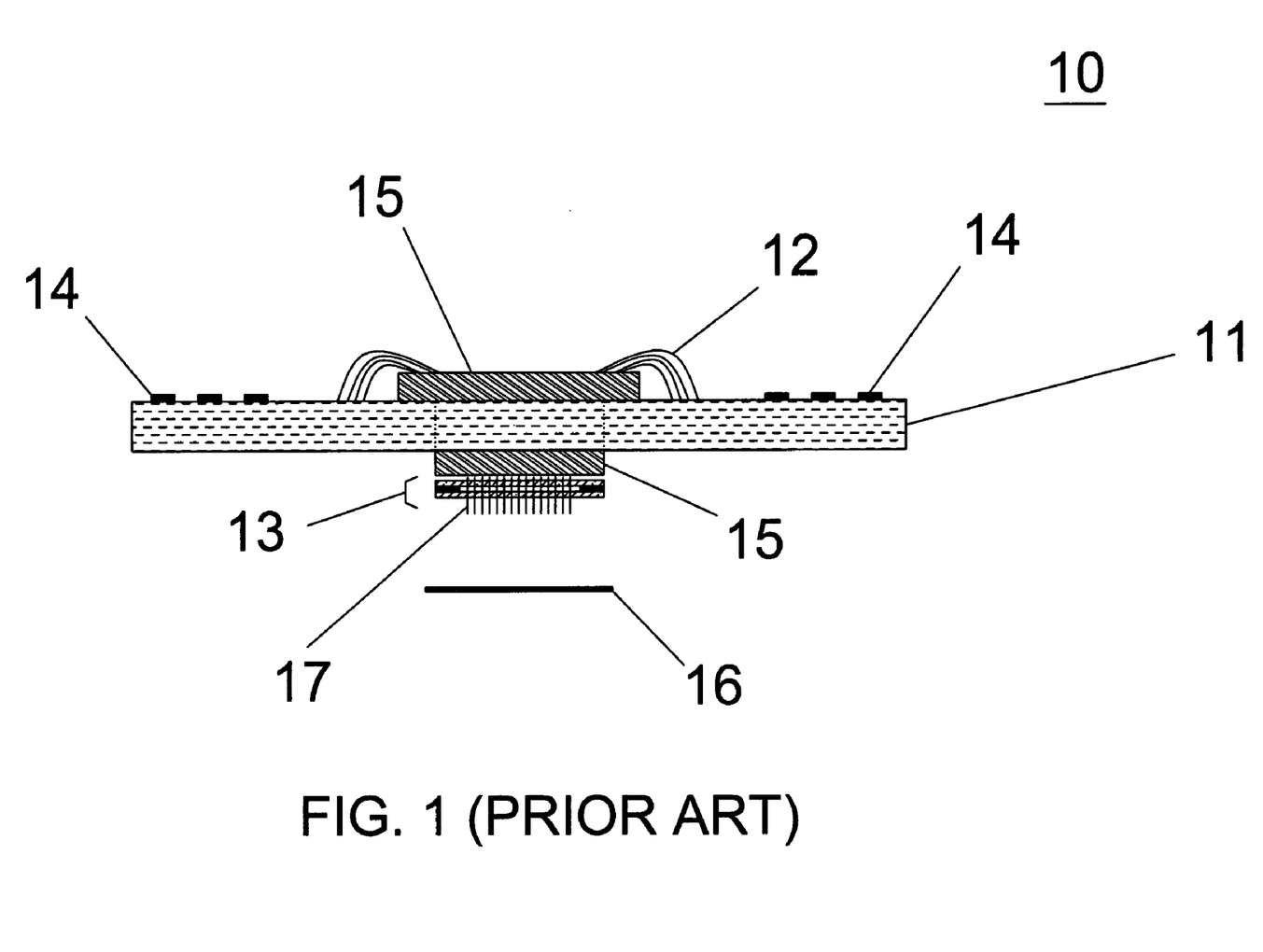
FIG. 1 is a cross-sectional view as well as a schematic drawing of the conventional probe card of the first kind.

As shown in FIG. 1, the conventional probe card (10) of the first kind includes a PCB (printed circuit board) (11), a plurality of pogoes (14), a plurality of wires (12), a space transfer ring (15), a probe head (13), as well as a plurality of probe needles (17). A bare die 16 undertaking testing is called DUT (device under test). The electrical connection is passing from the electric source (not shown) through the pogo pin (not shown) of the test machine, and the pogo (14), and through the inner conducting trace (not shown) of the PCB (11), then is finally connecting to the wire (12). The electrical connection of the other end of the wire (12) is passing through the center of the PCB (11), and extending downward to the probe head (13). Afterwards, the probe needle (17), wrapped and positioned by the probe head (13), continues its electrical connection, thereby, attains the function of transmitting signals and testing the bare dies (DUT). When it comes to testing the bare dies (DUT), the bare dies (DUT) are placed under the probe head (13) to make contact with the probe needles (17) to fulfill the objective of testing the bare dies (DUT).

Figure 2:
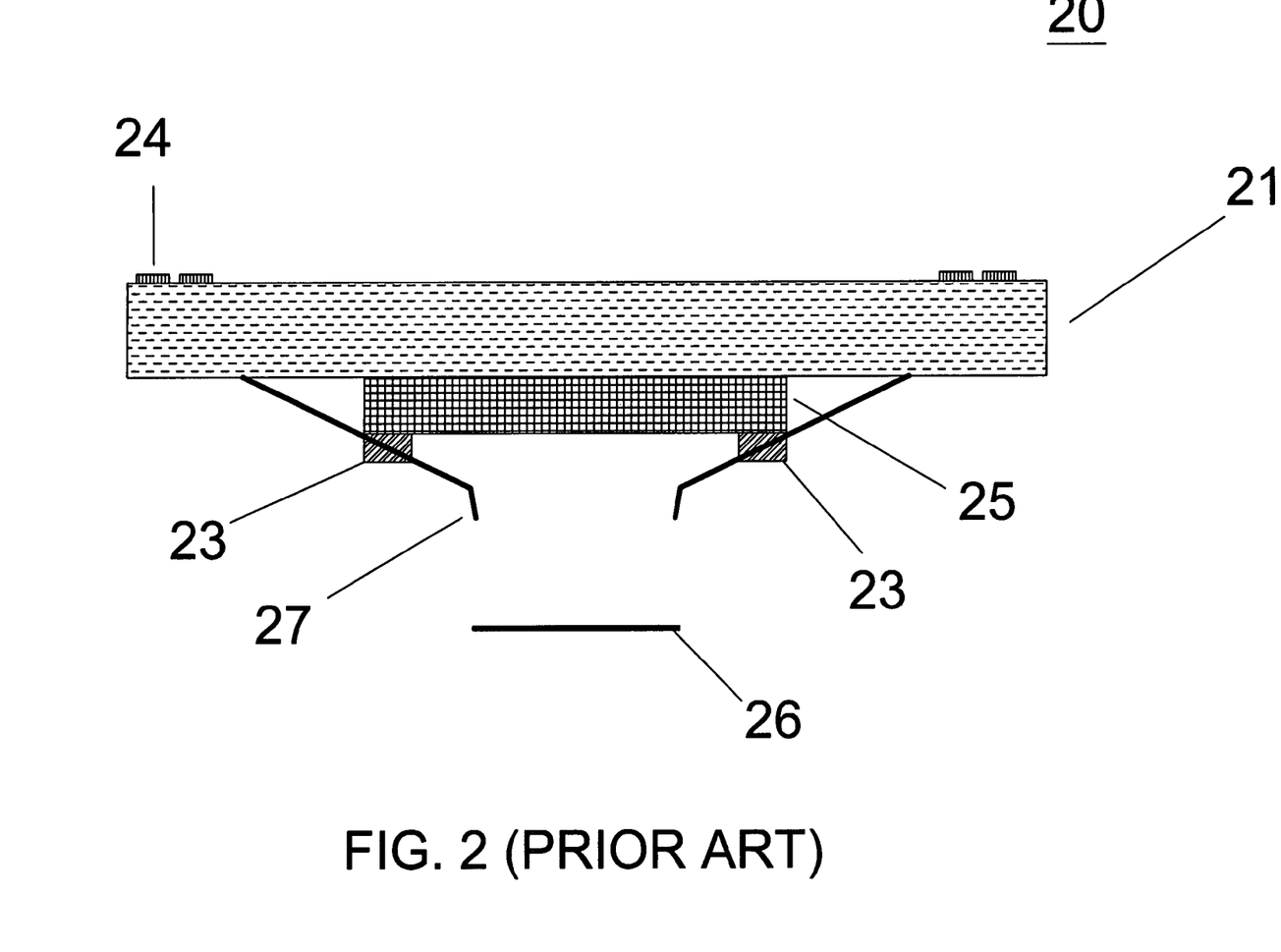
FIG. 2 is a cross-sectional view as well as a schematic drawing of the conventional probe card of the second kind.

As shown in FIG. 2, the conventional probe card (20) of the second kind includes a PCB (21), a plurality of pogoes (24), a space transfer ring (25), a plurality of probe needles (27), as well as an epoxy resin (23) located under the space transfer ring (25) for positioning the probe needles (27). The electrical connection is passing from the electric source (not shown) through the pogo pin (not shown) of the test machine, and the pogo (24), and through the inner conducting trace (not shown) of the PCB (21), then is finally connecting to the probe needles (27). The test machine provides the probe needles (27) with current and voltage for testing through this connection. When it comes to testing the bare dies (DUT) (26), the bare dies (DUT) (26) are placed under the probe card (20) to make contact with the probe needles (27) to fulfill the objective of testing the bare dies (DUT) (26).

Figure 3:
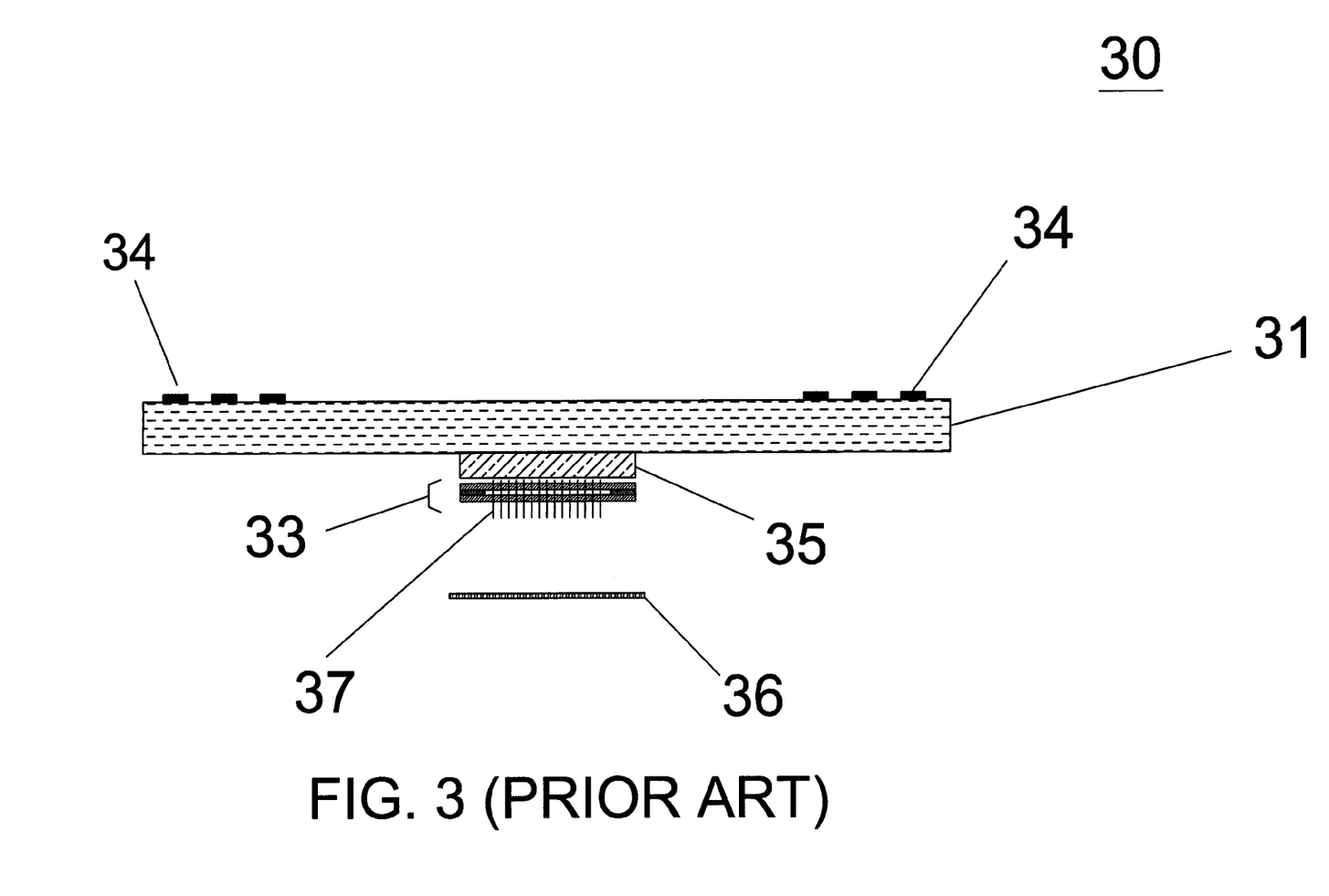
FIG. 3 is a cross-sectional view as well as a schematic drawing of the conventional probe card of the third kind.

As shown in FIG. 3, the conventional probe card (30) of the third kind includes a PCB (31), a plurality of pogoes 34, a substrate 35, a probe head (33), and a plurality of probe needles (37). The electrical connection is passing from the electric source (not shown) through the pogo pin (not shown) of the test machine, and the pogo 34, and through the inner conducting trace (not shown) of the PCB (31), then through the substrate 35, passing through the center of the PCB (31), and is finally connecting to probe head (33). The test machine provides the probe needles (37) with current and voltage for testing through this connection. When it comes to testing the bare dies (DUT) (36), the bare dies (DUT) (36) are placed under the probe head (33) to make contact with the probe needles (37) to fulfill the objective of testing the bare dies (DUT) (36).

As the test environment is becoming more and more complicated day after day, the causes of the damage of the conventional first, second, and the third kinds of probe cards (10), (20), (30) are becoming harder than ever to make a good judgment. Besides, oftentimes, since the conventional first, second, and the third kinds of probe cards (10), (20), (30) are unable automatically to monitor their service condition, the operators or the maintenance people need to use some kinds of indirect methods to obtain the service information. For instance, one might obtain the service information through copying the number of test times of the DUT stored in the test machine, or the voltage and current provided by the test machine. In terms of the maintenance people, this type of diagnosis for maintaining the conventional first, second, and the third kinds of the probe cards (10), (20), (30) is not only time-consuming but also troublesome. Especially, when the conventional first, second, and the third kinds of probe cards (10), (20), (30) are in abnormal condition during the service, one often misses the golden time of disposing of the abnormal problems since the problems are hard to be found out. What is even worse is that the records for the service information are oftentimes odds and ends fragments and are not integrated ones since the information are obtained through indirectly copying at the test machine. There exists a lot of subjective judgment and conjecture, and are short of objective or scientific data. In consequence, this kind of information can lead to wrong judgments in diagnosis since the breakdown or fault problem of the conventional first, second, and the third kinds of the probe cards (10), (20), (30) is difficult to find out. As the size of die and pad space are getting smaller and smaller nowadays, die products are more precise than ever, and the semiconductor industry has become more and more complicated. Therefore, the room for improving the design and maintenance of probe equipment and probe card is still rather large, and this is the key point for the future development in die testing technology.

SUMMARY OF THE INVENTION

In light of the disadvantages of the prior arts, the invention provides a multi-function probe card that aims to ameliorate at least some of the disadvantages of the prior art or to provide a useful alternative. The multi-function probe card provided by the invention employs various instruments and devices to acquire objective parametric data. This is to make an integrated record to facilitate the data acquisition and analysis, and in the meantime, to provide the functions for real time display and warning signals, thereby, is helpful in reading and diagnosing the causes of abnormal function to improve the maintenance efficiency.

Therefore, in order to compensate the above-mentioned imperfection, of the prior art, one of the object of the invention is to provide a multi-function probe card. The multi-function probe card has a counter to count the number of piece of the DUT, thereby, to generate a "piece number sequence parameter", as well as a electric signal measuring device to acquire the current and voltage signals of the probe needle, thereby, to generate the current and voltage parameters.

It is another object of the invention to provide a multi-function probe card that has a parameter processing system that can process the above-mentioned parameters and make a record for performing analysis and operation.

It is a further object of the invention to provide a multi-function probe card that also has a display and warning devices for diagnosis and for judging the abnormal function.

In one of the embodiments of the invention, the processing unit of the multi-function probe card of the invention can be a microprocessor, a program-executing memory, or a data register memory, to fulfill the function for program execution and processing data register.

In another embodiment of the invention, the storing unit of the multi-function probe card of the invention can be a disk-recording device, a flash memory, or a portable memory card, to store the parametric data built up by the storing unit.

In another embodiment of the invention, the real time display unit of the multi-function probe card of the invention can be a visible device such as an LCD (liquid crystal display), a seven-segment display, a CRT (cathode ray tube) display unit, or a real time printing device.

In further embodiment of the invention, the alarm unit of the multi-function probe card of the invention can be a warning light and/or a buzzer to fulfill the function of warning as well as monitoring the condition of the probe card.

To attain the above-mentioned objects, the invention provides a multi-function probe card includes a PCB, a plurality of probe needles, a counter for counting the number of the piece of dies to acquire a "piece sequence parameter", a signal-measuring device for measuring the current and voltage signals etc. via the probe to acquire a current, and a voltage parameters etc. as well as a parametric processing system. The parametric processing system includes an I/O unit (input/output unit), a processing unit, a time providing unit, a real time display unit, and a storing unit. The time providing unit provides the processing unit with every time-base of the DUT (device under test). Moreover, the piece sequence parameter, current parameter, and voltage parameter can be input into the processing unit through the I/O unit. Thereafter, a parametric data structure can be set up to record and calculate in accordance with the datum and parameters, and finally to display service processes and conditions of the probe card through the real time display unit.

BRIEF DESCRIPTION OF THE DRAWINGS

The accomplishment of this and other objects of the invention will become apparent from the following description and its accompanying drawings of which.

DETAILED DESCRIPTION OF THE PREFERRED EMBODIMENT

Figure 4:
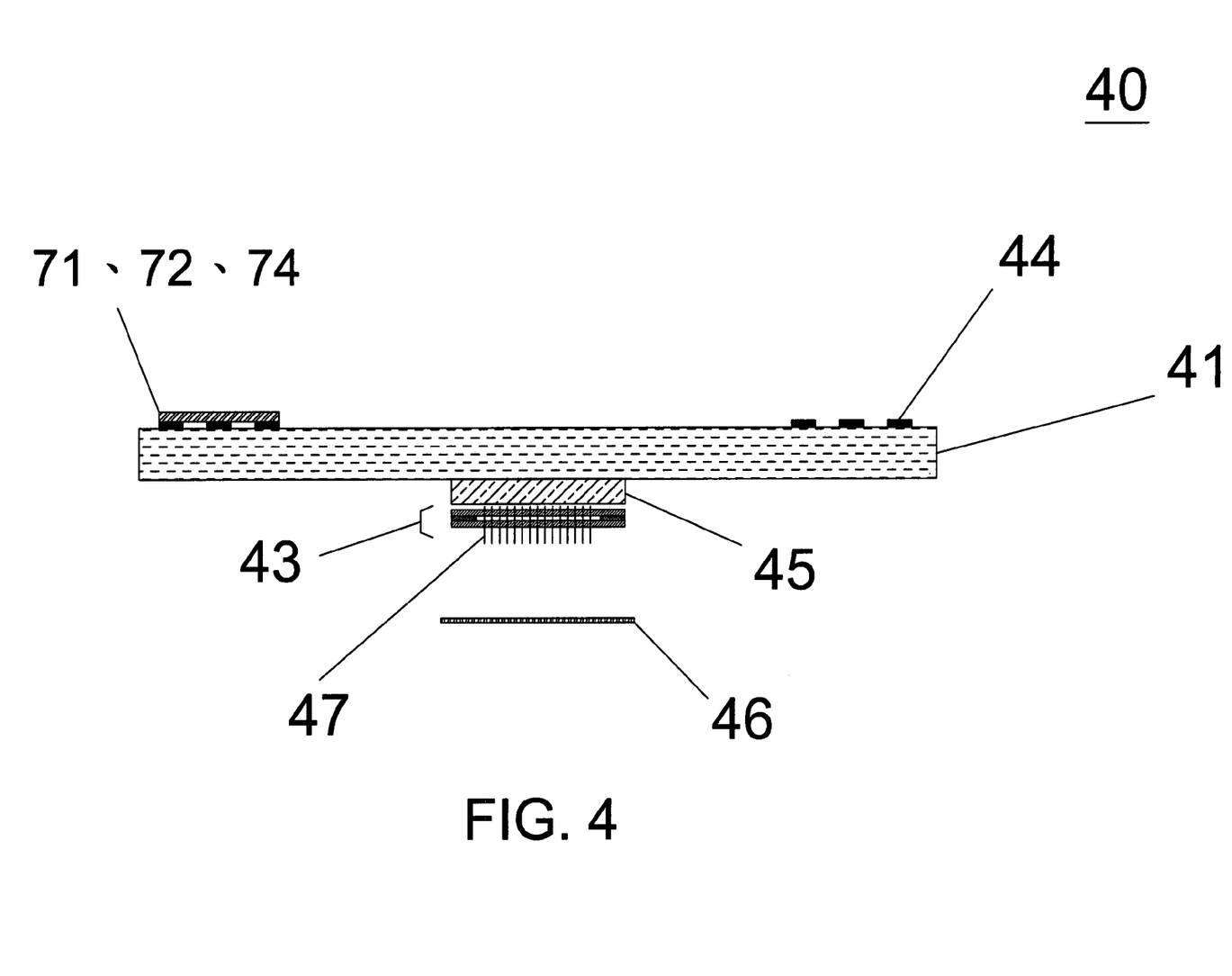
FIG. 4 is a cross-sectional view as well as a schematic drawing of the multi-function probe card of the invention.
Figure 6:
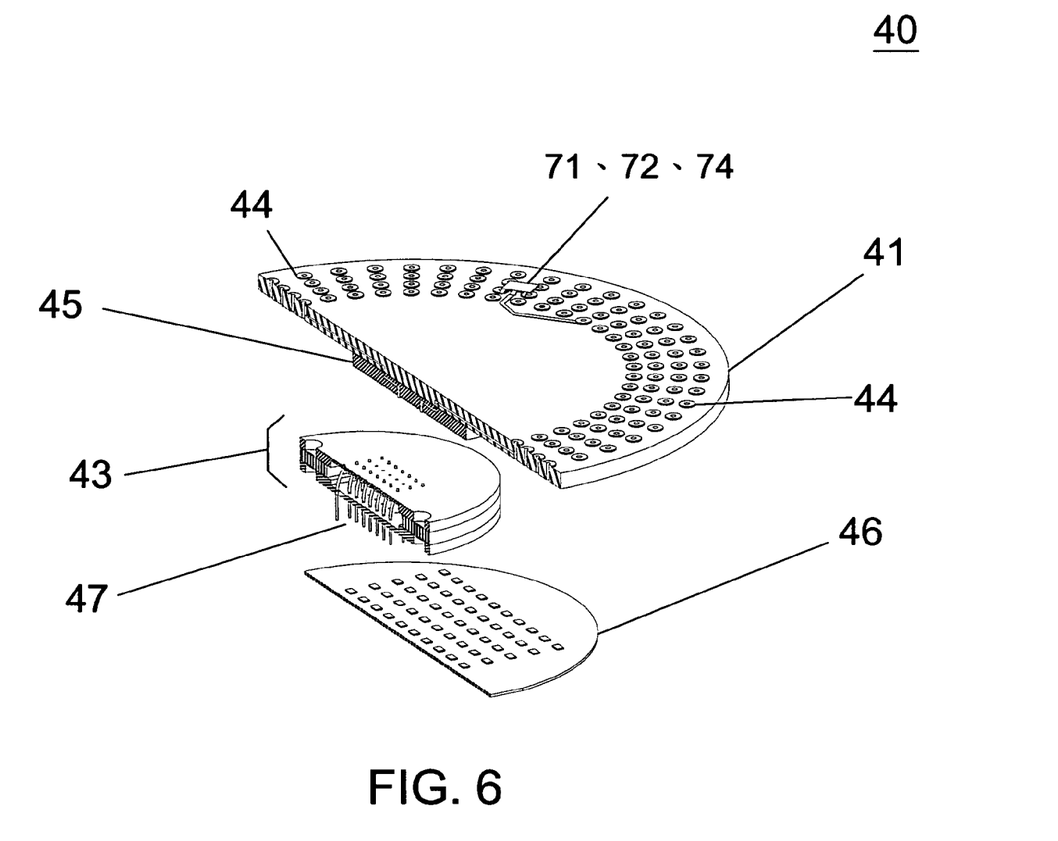
FIG. 6 is a partial cross-sectional and top isometric view of the parametric processing system of the multi-function probe card of the invention.

The multi-function probe card of the invention described as follows is manufactured in accordance with the above-mentioned conventional probe card of the third kind. As shown in FIG. 4 and FIG. 6, the multi-function probe card of the invention (40) includes a PCB (printed circuit board) (41), a plurality of pogoes (44), a substrate (45), a probe head (PH) (43), a plurality of probe needles (47), a counter (71), a signal measuring device (72), and a parameter processing system (74). A bare die (46) under testing is called DUT (device under test). The electrical connection of the multi-function probe card (40) is passing from the electric source (not shown) through the pogo pin (not shown) of the test machine, and the pogo (44). It then passes through the inner conducting trace (not shown) of the PCB (41), the substrate (45), and passing through the center of the PCB (41), then, is finally connecting to probe head (43). Afterwards, the probe needle (47), wrapped and positioned by the probe head (43), continues its electrical connection, thereby, attains the function of transmitting signals and testing the bare dies (DUT) (46). The probe needles (47) need to comply with the micro space of the DUT, and the space of the inner conducting trace (not shown) of the PCB (41) is at least ten times as wide as those of the probe needles (47). The wide space of the inner conducting trace of the PCB (41) can transform into narrow space of the probe needles (47) through the space transformation of the substrate (45). In this sense, the substrate (45) can also play a role as a space transfer. When it comes to testing the bare dies (DUT) (46), one can place the bare dies (DUT) (46) under the probe head (43) to make contact with the probe needles (47) to fulfill the object of testing the bare dies (DUT) (46).

The counter (71) can detect any conductor on the probe card (40) connecting to it. This conductor can be the pogo (44) or the trace (not shown) on the PCB (41). In this manner, the probe needle (47) electrically connected to the pogo (44) or the trace of the PCB (41) can be the tracing target of the counter (71). The counter (71) can measure out the voltage or current signal for each of the trace, then, the counter (71) further makes a judgment on the time slot interval of the voltage and current signals switching on the trace to generate a "piece sequence parameter". For instance, while the test machine is performing testing, one can cut off the voltage and current signals provided to the trace during the time interval between this DUT bare die (46) and the subsequent DUT bare die (46), in the mean time, start the counter (71) to count the number of pieces of the DUT bare die (46).

The signal-measuring device (72) can be a current-measuring meter (not shown), a voltage-measuring meter, or a resistance-measuring meter (not shown) etc. For example, the current-measuring meter can detect any conductor on the probe card (40) connecting to it. This conductor can be the pogo (44) or the trace (not shown) on the PCB (41). Thus, the current-measuring meter can detect and acquire the current signals passing through each/or any trace and generate a current parameter.

Similarly, the voltage-measuring meter can detect any conductor on the probe card (40) connecting to it. This conductor can be the pogo (44) or the trace (not shown) on the PCB (41). Thus, the voltage-measuring meter can detect and acquire the voltage signals passing through each/or any trace and generate a voltage parameter.

Figure 5:
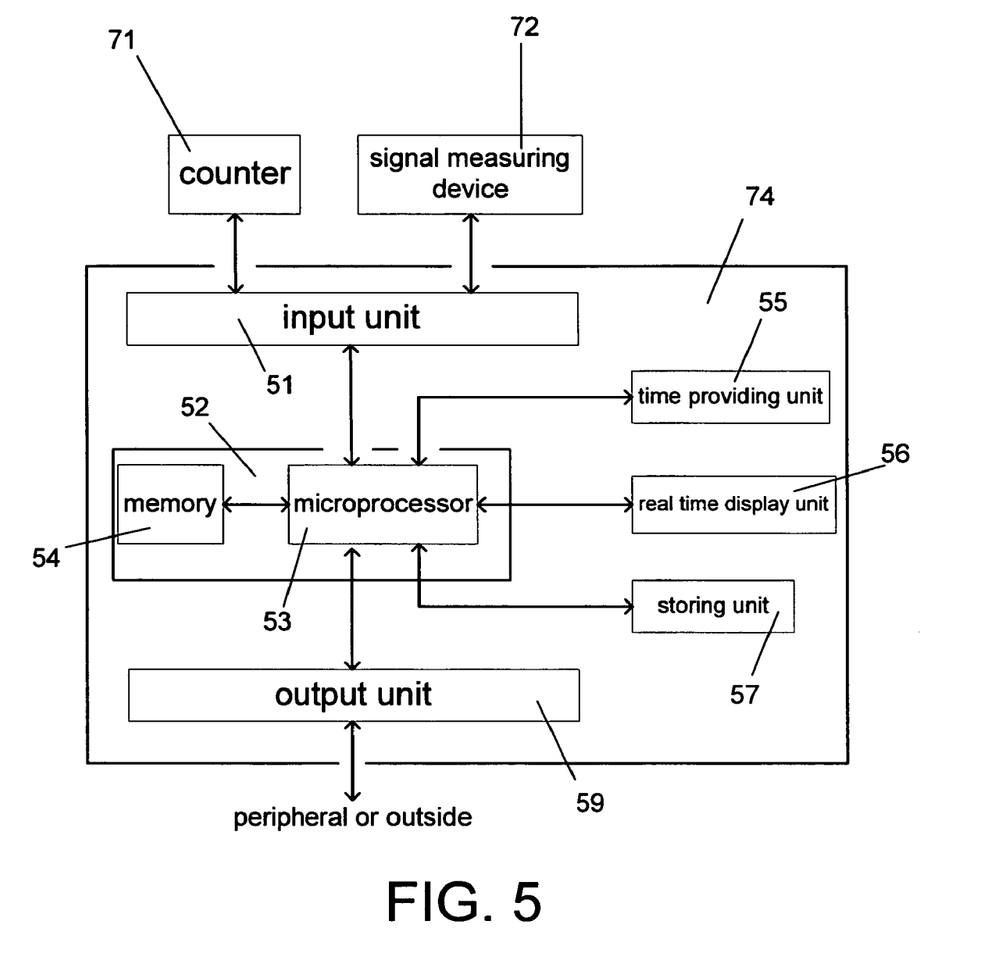
FIG. 5 is a schematic block diagram of the assembling structure of the invention.

As shown in FIG. 5, the parameter processing system (74) includes an input/output unit (51)/(59), a processing unit (52), a real time display unit (56), and a storing unit (57). (refer to FIG. 6). Among them, the processing unit (52) further includes a microprocessor (53), a memory (54) that has the functions of program execution and data register memory. Besides, the processing unit (52) is in charge of the program execution. The hardware requirement in this preferred embodiment is not limited to these, it can add some other microprocessors (53) or piece of memory (54) depending upon the consideration on the processing speed.

The "piece sequence parameter" generated by the counter (71) as well as the current and voltage parameters generated by the signal-measuring device (72) are input to the processing unit (52) through the input unit 51. The processing unit (52) employs the "piece sequence parameter" as a datum for piece of DUT while the "time providing unit" (55) provides processing unit (52) with a time datum for each of the DUT bare dies (46). Thereafter, the processing unit (52) sets up a parametric data structure in terms of the piece datum of the DUT bare die, current parameter, voltage parameter, and time datum. This is for recording the service process and condition of the probe.

For example, when it comes to test the $n^{th}$ piece of DUT bare die for the probe card (40), the counter (71) generates a "piece sequence parameter" n while the signal measuring device (72) generates a current parameter of $X_u(t)$ ampere and a voltage parameter of $Y_u(t)$ volt after detecting. Among them, the variable u indicates a serial number of the probe (47), while t can be a specific continuous time internal or a discrete instantaneous time. These parameters are input to the processing unit (52), meanwhile, the time providing unit (55) provides the processing unit (52) with time datum of "AA: BB: CC", wherein AA, BB, and CC stand for "year: month: date", or "hour: minute: second", or "month: date: hour" depending on the situations. Moreover, processing unit (52) sets up a parametric data structure {n, $X_u(t)$, $Y_u(t)$, AA: BB: CC}, to reason by analogy, the probe card (40) continues to test the parametric data structure of the $(n+1)^{th}$ piece of DUT bare die. Moreover, as the probe card (40) tests the first piece of DUT bare die (46), the counter (71) will generate the value "1" of "piece sequence parameter", and the probe card (40) possesses ten probe needles (47) with serial number a, b, c, d, e respectively to represent u. In the meantime, the signal-measuring device (72) will generate current parameters $x_a$=3.12 mA (mini-ampere), $X_b$=3.22 mA, - - -, $x_j$; =3.56 mA etc. and voltage parameters $y_a$=4.51 V (volt), $y_b$=4.22 V, - - - , $y_j$=4.56 V etc. after detecting these ten probe needles (47) at a certain point of time. Subsequently, these parameters are input into processing unit (52), and in the meantime, the time providing unit (55) provides processing unit (52) with a time datum {23: 10: 31} to indicate that the point of time is 23-hour, 10-minute, and 31-second. Consequently, the processing unit (52), based on the above-mentioned parameters, sets up the parametric data structure {1, $x_a$ =3.12 mA, $y_a$=4.51 V, 23: 10: 31}, {1, $x_b$=3.22 mA, $y_b$=4.22 V, 23: 10: 31} - - - {1, $x_j$=3.56 mA, $y_j$=4.56 V, 23: 10: 31}. To reason by analogy through the above-mentioned statements, one can obtain another parametric data structure when the probe card (40) tests the second piece of DUT bare die (46). The parameters of the parametric data structure are not limited in this embodiment; one can add or leave out parameters depending on the user's requirement.

The processing unit (52) also connects to the real time display unit (56) and the storing unit (57) through an I/O (input/output) interface (not shown). The I/O interface provides only the input/output function of the internal data of the parameter processing system (74). Therefore, the output interface can also be called as internal output interface. The processing unit (52) can calculate the condition of each of the trace in real time, for example, the current of $X_u$ (t) is too high, the $u_{th}$ probe needle appears in abnormal condition etc. It then outputs the service condition, parametric data structure etc. to the real time display unit (56) to fulfill the function of output display. There is no restriction as for the sequence of execution such as the actions of the processing unit (52) setting up the parametric data structure, or calculating the condition for each of the probe card.

The real time display unit (56) can be a visible device. The visible device is the one that users can identify and understand through their senses of sight. The users can constantly monitor the condition of the probe needles (47) on the probe card (40). Moreover, the visible device includes but not limits to an LCD, a seven-segment display, a CRT (cathode ray tube) display unit, or a real time printing device to fulfill the functions of clearly displaying or appearing the condition of the probe card. The real time display unit (56) can also be a warning device. As the condition of the probe needle (47) appears abnormal, the processing unit (52) can trigger the warning device to call attention or notify the users. The warning device can be a warning lamp or a buzzer to attain the warning effect.

The processing unit (52) transfers the built parametric data structure and/or probe card condition to store in the storing unit (57) that is at least but not limited to a disk memory device or a flash memory etc. such as micro-disk or embedded type flash memory. The storing unit (57) can also be a portable memory card, such as CF Card (compact flash card), SM card (smart media card) etc. When it comes to acquiring the internal data of the storing unit (57) or replacing the storing unit (57), all one has to do is to insert or to remove the portable memory card to facilitate the data acquisition for the user.

The user for monitoring the probe card conditions, through the output unit 59, can also output the parametric data structure and/or probe card conditions to the peripherals of the parameter processing system (74) instead of the parameter processing system (74) itself. Therefore, the output unit 59 can also be called as an external output interface that can be an interface of an independent controller or a network interface etc. What is more, peripherals or the external field can be a set-up database system to facilitate the preservation and monitored problems, for example, through a two-day time period, one outputs the parameter processing system (74) to the database system.

Efficacy of the Invention

As the probe card (40) of the invention possesses the function of recording the service conditions, the data stored in the memory unit can provide objective reference data whenever the probe card (40) needs to be maintained.

Therefore, the maintenance people for maintaining the probe card (40) can shorten the time on undertaking diagnosis and accurately control the direction of maintenance and improvement.

Meanwhile, the device of the real time display unit (56) can make the probe card user grasp the golden time for disposing of the abnormal problem to avoid being too late to find out the abnormal condition that results in even greater loss.

As far as the manufacturer is concerned, since the data values kept in the storing unit (57) of the invention record the service history of the probe card (40), one can trace the service process of the probe card (40) to understand further the life cycle of the probe card (40). One can say that this is a great break-through in the probe card manufacturing industry.

While the invention has described by way of example and in terms of the preferred embodiment, it is understood that the invention is not restricted to the disclosed embodiments. On the contrary, it intends to cover various modifications and similar arrangements as would be apparent to those skilled in the art. For instance, although the manufacturing of the multi-function probe card of the invention is based on the conventional probe card of the first kind and is depicted as a preferred embodiment, the manufacturing of the multi-function probe card of the invention can also be based on the conventional probe card of the second and the third kind. The manufacturing of the multi-function probe card of the invention can also be based on any other similar conventional probe cards that are not quoted here as examples. Therefore, the scope of the appended claims should be accorded the broadest interpretation in order to encompass all such modifications and similar arrangements.

It will become apparent to those people skilled in the art that various modifications and variations can be made to the structure of the invention without departing from the scope or spirit of the invention. In view of the foregoing description, it is intended that all the modifications and variation fall within the scope of the following appended claims and their equivalents.

What is claimed is:

1. A multi-function probe card, comprising:
   a PCB (41);
   a plurality of probe needles (47), an end of each of the probe needles (47) is connected to the PCB (41);
   a counter (71), for detecting the probe needles (47) to count the piece of the DUT bare die (46) and generate a "piece sequence parameter";
   a signal-measuring device (72), for measuring the current and voltage passing through the probe needles (47) to generate current and voltage parameters; and
   a parameter processing system (74), further comprising an I/O unit (51)/(59), a processing unit (52), a time providing unit (55), a real time display unit (56), and a storing unit (57);
      whereby, the "piece sequence parameter" as well as the current and voltage parameters can be input into the processing unit (52) through the I/O unit (51)/(59); the processing unit (52) employs the "piece sequence parameter" as a datum for piece of DUT while the "time providing unit" (55) provides processing unit (52) with a time datum for each of the DUT bare dies (46); thereafter, the processing unit (52) sets up a parametric data structure in terms of the piece datum of the DUT bare die (46), current parameter, voltage parameter, and time datum for recording the service process and condition of the probe; subsequently, the processing unit (52) real timely calculate the conditions of the probe card (40) and display the service process and conditions of the probe card (40).

2. The multi-function probe card as claimed in claim 1, wherein the counter (71) can measure the switching time slot interval of the current or voltage signals to generate the "piece sequence parameter" to fulfill the function of counting of the DUT bare die (46).

3. The multi-function probe card as claimed in claim 1, wherein the processing unit (52) can be selected from the group consisting of a microprocessor, a program-executing memory, and a data register memory, to fulfill the function for program execution and processing data register.

4. The multi-function probe card as claimed in claim 1, wherein the real time display unit (56) can be a visible device selected from the group consisting of an LCD (liquid crystal display), a seven-segment display, a CRT (cathode ray tube) display unit, a real time printing device, as well as a warning lamp & a buzzer of a warning device, to fulfill the functions of displaying, warning, and monitoring the condition of the probe card.

5. The multi-function probe card as claimed in claim 1, wherein the storing unit (57) can be selected from the group consisting of a disk-recording device, a flash memory, and a portable memory card, to store the parametric data built up by the storing unit; the storing unit (57) can also be a portable memory card selected from the group consisting of a CF Card (compact flash card) and SM card (smart media card).

6. A multi-function probe card, comprising:
   a PCB (41);
   a plurality of probe needles (47), an end of each of the probe needles (47) is connected to the PCB (41);
   a counter (71), for detecting the probe needles (47) to count the piece of the DUT bare die (46) and generate a "piece sequence parameter"; and
   a parameter processing system (74), further comprising an I/O unit (51)/(59), a processing unit (52), a time providing unit (55), a real time display unit (56), and a storing unit (57);
      whereby, the "piece sequence parameter" as well as the current and voltage parameters can be input into the processing unit (52) through the I/O unit (51)/(59); the processing unit (52) employs the "piece sequence parameter" as a datum for piece of DUT while the "time providing unit" (55) provides processing unit (52) with a time datum for each of the DUT bare dies (46); thereafter, the processing unit (52) sets up a parametric data structure in terms of the piece datum of the DUT bare die (46), current parameter, voltage parameter, and time datum for recording the service process and condition of the probe; subsequently, the processing unit (52) real timely calculate the conditions of the probe card (40) and display the service process and conditions of the probe card (40).

7. The multi-function probe card as claimed in claim 6, wherein the counter (71) can measure the switching time slot interval of the current or voltage signals to generate the "piece sequence parameter" to fulfill the function of counting of the DUT bare die (46).

8. The multi-function probe card as claimed in claim 6, wherein the processing unit (52) can be selected from the group consisting of a microprocessor, a program-executing memory, and a data register memory, to fulfill the function for program execution and processing data register.

9. The multi-function probe card as claimed in claim 6, wherein the real time display unit (56) can be a visible device selected from the group consisting of an LCD (liquid crystal display), a seven-segment display, a CRT (cathode ray tube) display unit, a real time printing device, as well as a warning lamp & a buzzer of a warning device, to fulfill the functions of displaying, warning, and monitoring the condition of the probe card.

10. The multi-function probe card as claimed in claim 6, wherein the storing unit (57) can be selected from the group consisting of a disk-recording device, a flash memory, and a portable memory card, to store the parametric data built up by the storing unit; the storing unit (57) can also be a portable memory card selected from the group consisting of a CF Card (compact flash card) and SM card (smart media card).

* * * * *